(12) United States Patent
Liu

(10) Patent No.: US 7,013,560 B2
(45) Date of Patent: Mar. 21, 2006

(54) PROCESS FOR FABRICATING A SUBSTRATE

(75) Inventor: Po-Chih Liu, Taipei County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 150 days.

(21) Appl. No.: 10/707,015

(22) Filed: Nov. 14, 2003

(65) Prior Publication Data
US 2004/0238214 A1 Dec. 2, 2004

(30) Foreign Application Priority Data
May 29, 2003 (TW) .............................. 92114522 A

(51) Int. Cl.
*H05K 3/02* (2006.01)
*H05K 3/10* (2006.01)
(52) U.S. Cl. ............................ 29/846; 29/825; 29/830; 29/831; 29/852; 174/255; 174/262; 427/250; 427/255.7

(58) Field of Classification Search ................. 29/846, 29/825, 830, 831, 852; 174/255, 262; 427/250, 427/255.7
See application file for complete search history.

(56) References Cited

U.S. PATENT DOCUMENTS 5,745,984 A * 5/1998 Cole et al. ..................... 29/834
6,931,724 B1 * 8/2005 Rokugawa et al. ........... 29/852

* cited by examiner

*Primary Examiner*—A. Dexter Tugbang
*Assistant Examiner*—Tim Phan
(74) *Attorney, Agent, or Firm*—Jianq Chyun IP Office

(57) ABSTRACT

A substrate comprises at least a semi-finished substrate, a circuit line, a contact and a solder mask layer. The circuit line and the contact are formed on the semi-finished substrate. The circuit line and the contact are connected together non-integrally. The solder mask layer is formed over the semi-finished substrate to cover the circuit line. The solder mask layer has an opening in which the contact is formed.

6 Claims, 12 Drawing Sheets

PROCESS FOR FABRICATING A SUBSTRATE

CROSS REFERENCE TO RELATED APPLICATIONS

This application claims the priority benefit of Taiwan application Ser. no. 92114522, filed May 29, 2003.

BACKGROUND OF INVENTION

1. Field of the Invention

The present invention relates to a substrate and a process for fabricating the same. More particularly, the present invention relates to a substrate having contacts separated by a minute distance and process for fabricating the same.

2. Description of the Related Art

In the semiconductor industry, the manufacturing process of Integrated Circuit (IC) can be divided into three steps: fabricating electronic devices, such as transistor or metal oxide semiconductor (MOS), etc., forming patterned fine circuits to electrically connect the electronic devices with each other, and packaging a chip. The main objective of packaging a chip is to protect a chip from moisture and impurities and to electrically connect a chip to a substrate. Thereafter, the chip is electrically connected to a substrate either through conductive wires or bumps and then the entire chip together with the conductive wires or bumps is enclosed using some packaging material for protecting the chip and the electrical connections between the chip and the substrate.

However, in a flip chip process, bumps are attached to the chip before the chip joins with the substrate via the bumps. Hence, the pitch between neighboring bumps as well as the pitch between neighboring contacts on the substrate will directly affect the total number of input/output terminals. The number of input/output terminals between the chip and the substrate will also affect the size of the chip. As electronic technologies continue to advance, more multi-functional, personalized electronic products are developed in the market. To gain a competitive edge in the market, most electronic manufacturers aim at miniaturizing and lightening their products. Hence, most chips and substrates are designed to occupy as small area and have as small a thickness as possible. Yet, squeezing more input/output terminals into the chip and the substrate for electrical connection demands a reduction of the pitch between neighboring contacts on the substrate as well as the pitch between neighboring bumps.

In the following, a method of fabricating a conventional substrate and some of the limitations in fabricating process is described. FIGS. 1A through 1G are magnified schematic cross-sectional views showing the progression of steps for fabricating a conventional substrate.

As shown in FIG. 1A, a semi-finished substrate 110 is provided. The substrate 110 comprises a plurality of insulating layers 111, 112, 113, 114, 115 and a multiple of patterned metallic layers 121, 122, 123, 124, alternately laid over each other. The semi-finished substrate 110 also has at least a through hole 131 that passes through the substrate 110. The wall of the through hole 131 has a conductive material layer 132 for electrically connecting the patterned metallic layers 121, 122, 123, 124. The insulating layers 111 and 115 have a plurality of openings 133 and 134 that exposes the patterned circuit layers 121 and 124 respectively.

Thereafter, as shown in FIG. 1B, a roughening process is carried out to roughen the exposed surface of the insulating layers 111 and 115. Next, an electroless plating method can be used to form a seed layer 151 and 152 on the insulating layers 111 and 115, on the sidewalls of the openings 133 and 134 in the insulating layers 111 and 115 and on the patterned circuit layers 121 and 124, respectively.

As shown in FIG. 1C, photoresist layers 153 and 154 are formed over the seed layers 151 and 152 respectively. A plurality of patterned openings 155, 156 that passes through the photoresist layers 153, 154 and exposes the seed layers 151, 152 is formed. The patterned openings 155, 156 include contact pattern (the patterned openings 155, 156 in FIG. 1C) and circuit pattern.

As shown in FIG. 1D, an electroplating operation is performed to form patterned metallic layers 157, 158 on the seed layer 151, 152 exposed by the patterned openings 155, 156 in the photoresist layers 153, 154. The patterned metallic layers 157, 158 include contact pattern (the patterned metallic layer 157, 158 in FIG. 1D) and circuit pattern. Thereafter, the photoresist layers 153, 154 is removed from the seed layers 151, 152 to expose the seed layers 151, 152 and form a structure as shown in FIG. 1E. Using the patterned metallic layers 157, 158 as an etching mask, the exposed seed layers 151, 152 are removed so that only the seed layers 151, 152 underneath the patterned metallic layers 157, 158 is retained and the insulating layers 111, 115 are exposed to the outside as shown in FIG. 1F.

As shown in FIG. 1G, a screen printing operation is carried out to form solder mask layers 159, 160 over the insulating layers 111, 115. The solder mask layers 159, 160 covers the circuit portion (not shown) of the patterned metallic layers 157, 158. Furthermore, the solder mask layers 159, 160 also have a plurality of openings 161, 162 that pass through the solder mask layers 159, 160 and exposes the contact portion (the patterned metallic layers 157, 158 in FIG. 1G) of the patterned metallic layers 157, 158. After completing the fabrication of the substrate 100, the substrate 100 is able to electrically bond with the bumps (not shown) on a flip chip via the contacts on the patterned metallic layer 157.

In the aforementioned fabrication process, size and pitch of the contacts will be directly affected by the tolerance of the patterned opening 155 in the photoresist layer 153 and the tolerance of the opening 161 in the solder mask layer 159. Hence, in the fabrication of the contacts, the photoresist layer 153 must have a larger patterned opening 155 and the solder mask layer 159 must have a larger opening 161. Ultimately, the contact portion of the patterned metallic layer 157 has to be larger just to ensure the formation of a proper junction between the bumps on a flip chip and the contact portion of the patterned metallic layer 157 on the substrate 100. Because the contact portion in the patterned metallic layer 157 is large, pitch between neighboring contacts in the substrate 100 must be increased. In other words, area occupation of the substrate 100 is increased. To match up with the distance of separation between the contacts in the substrate, the distance of separation between neighboring bonding pads on the chip must also be increased. Ultimately, the chip needs to occupy a larger surface area.

SUMMARY OF INVENTION

Accordingly, one object of the present invention is to provide a substrate and process for fabricating the same. Through a modification of the method of fabricating the substrate, a substrate with micro-distance separation between neighboring contacts and a hole-free pad is produced so that the substrate can have a higher contact density and a corresponding chip can have a higher bonding pad density.

To achieve these and other advantages and in accordance with the purpose of the invention, as embodied and broadly described herein, the invention provides a substrate. The substrate at least comprises a semi-finished substrate, at least a circuit line, at least a contact and a solder mask layer. Both the circuit line and the contact are formed on the semi-finished substrate and electrically connected together but they are not formed as an integral element. The solder mask layer is also formed above the semi-finished substrate covering the circuit line. The solder mask layer has an opening in which the contact is filled.

This invention also provides a process of fabricating a substrate at least comprising the following steps. First, a semi-finished substrate is provided. Thereafter, at least a circuit line is formed in the semi-finished substrate. A solder mask layer is formed over the semi-finished substrate to cover the circuit line. At least an opening that passes through the solder mask layer exposes a portion of the circuit line. Finally, a contact is formed within the opening of the solder mask layer such that the contact and the circuit line are electrically connected together.

According to one embodiment of this invention, the circuit line is formed on the semi-finished substrate by growing a seed layer over the substrate in an electroless plating operation and then forming a mask layer over the seed layer. At least a patterned opening that passes through the layer is formed in a patterning operation. An electroplating operation is carried out to form a circuit line inside the patterned opening. Thereafter, the mask layer is removed so that a portion of the seed layer is exposed. Finally, the exposed seed layer is removed.

According to one embodiment of this invention, a screen printing method is used to form the solder mask layer over the semi-finished substrate.

According to one embodiment of this invention, the method of forming the contact within the opening of the solder mask layer includes the following steps. First, an electroless plating operation is carried out to form a seed layer over the solder mask layer and the exposed circuit line within the opening of the solder mask layer. Thereafter, a mask layer is formed over the seed layer and then patterning out at least an opening that passes through the mask layer. The patterned opening is located roughly in alignment with the opening of the solder mask layer. Next, an electroplating operation is carried out to form a contact within the opening of the solder mask layer. Afterwards, the mask layer is removed so that a portion of the seed layer is exposed. Finally, the exposed seed layer is removed.

In brief, because the contact is formed in the opening only after the opening is formed in the solder mask layer, the size of the contacts is solely affected by the tolerance of the opening in the solder mask layer. Hence, the size and the location of each contact can be set more precisely. Through the reduction in the size of each contact and the accurate positioning of the contacts, the padless contacts having small contact size and small contact pitch are formed in the substrate. Therefore, the substrate will occupy a smaller area. Similarly, with a reduction in the size and pitch of the contacts in the substrate, the pitch of the bonding pads in the chip can be reduced. In other words, the chip will occupy a smaller area as well.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
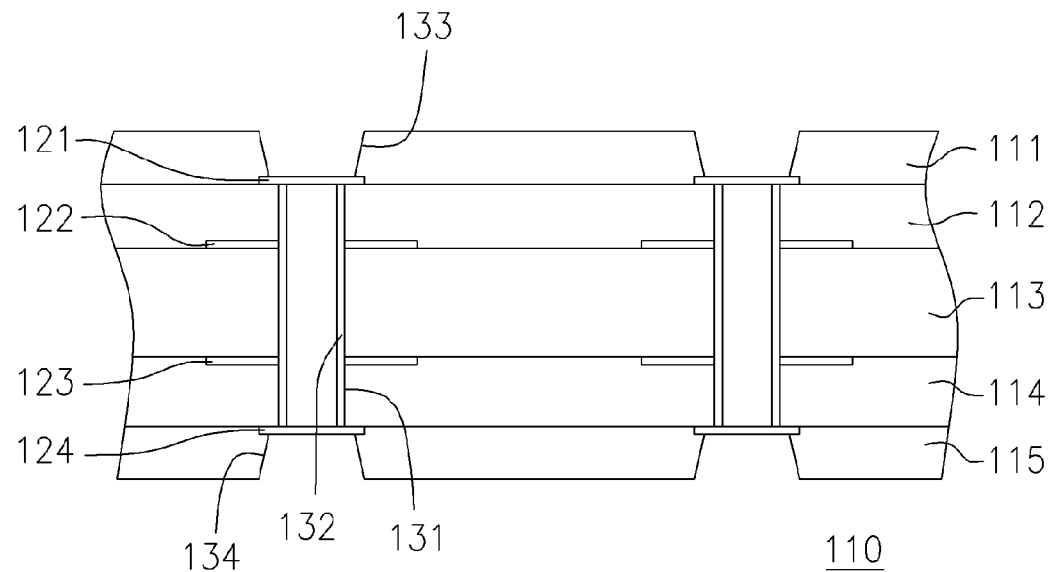
FIGS. 1A through 1G are magnified schematic cross-sectional views showing the progression of steps for fabricating a conventional substrate.
Figure 1B:
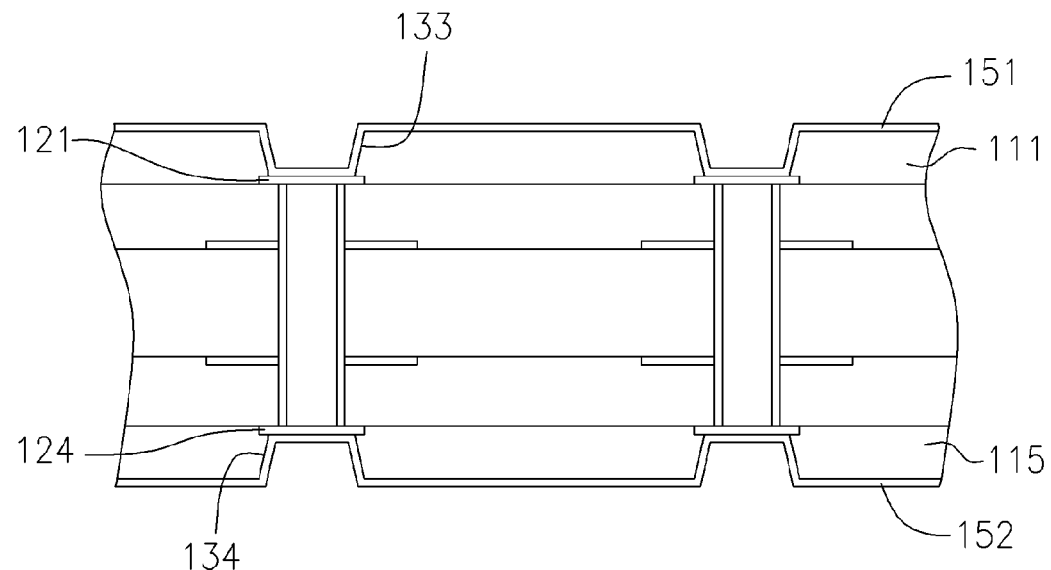
Figure 1C:
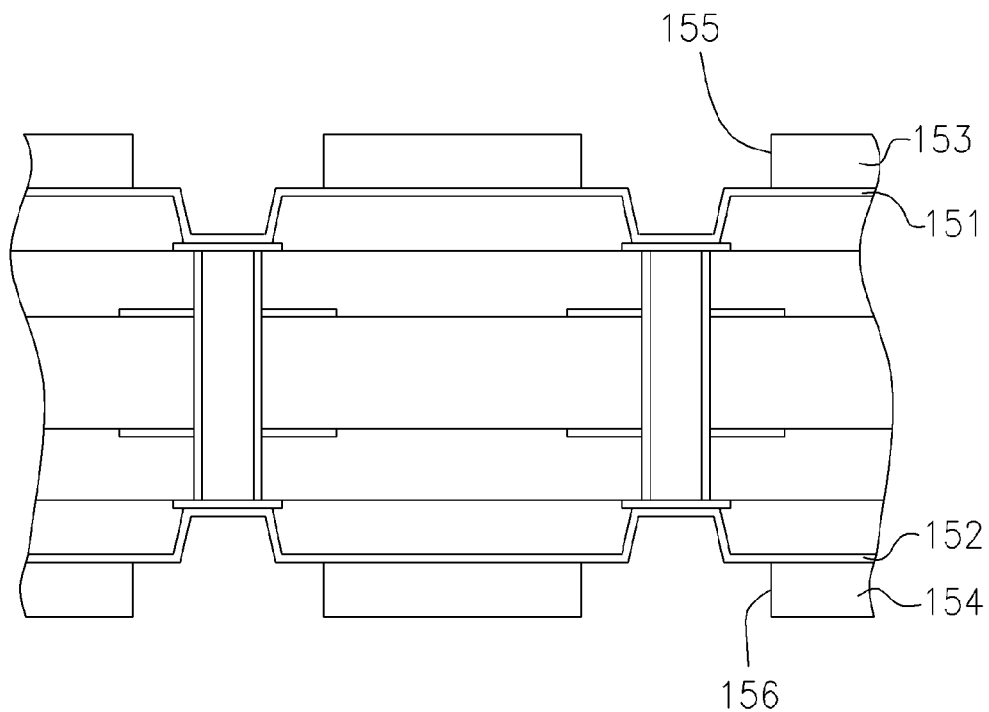
Figure 1D:
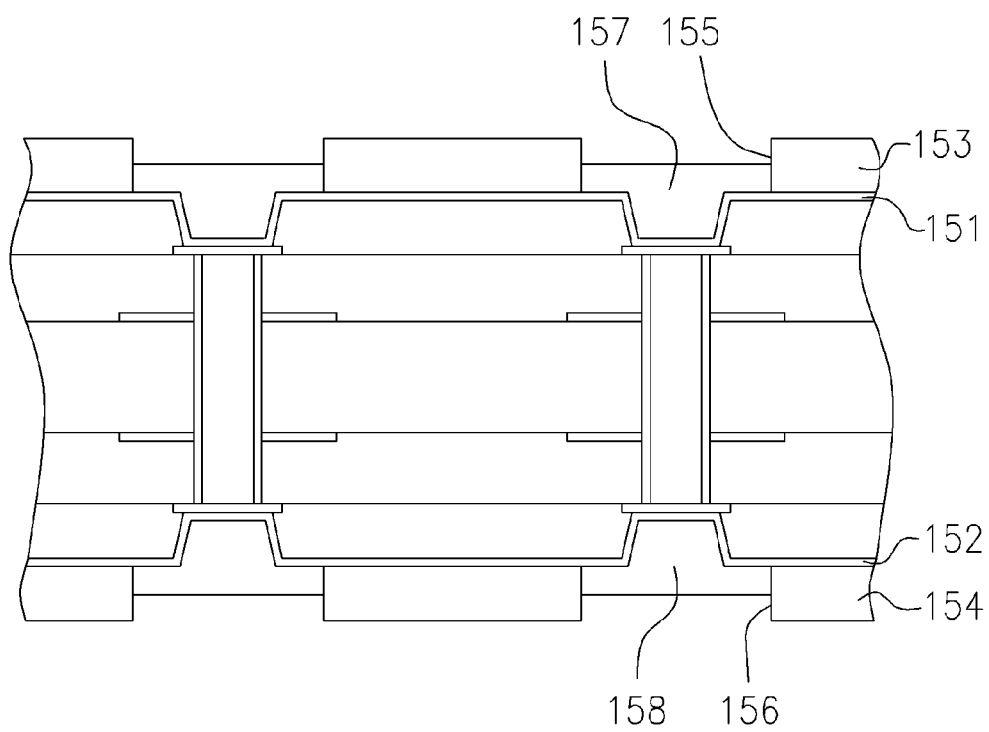
Figure 1E:
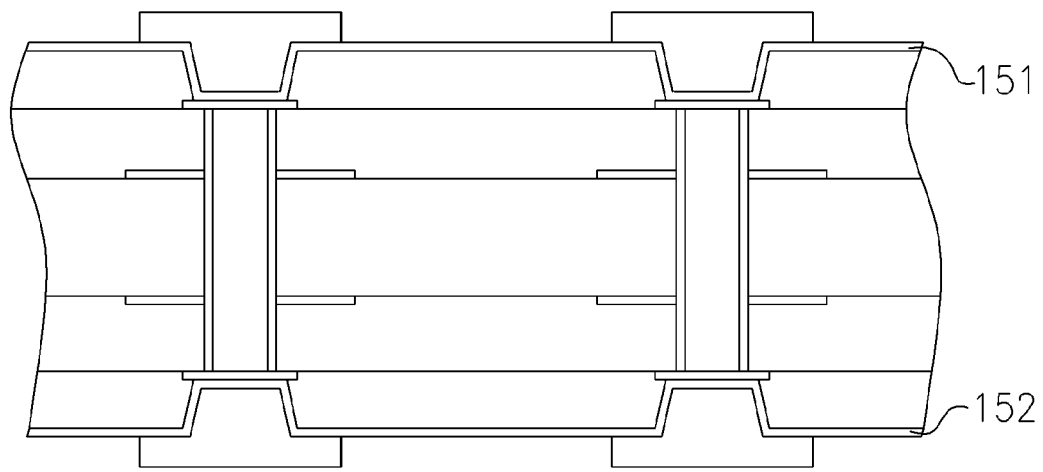
Figure 1F:
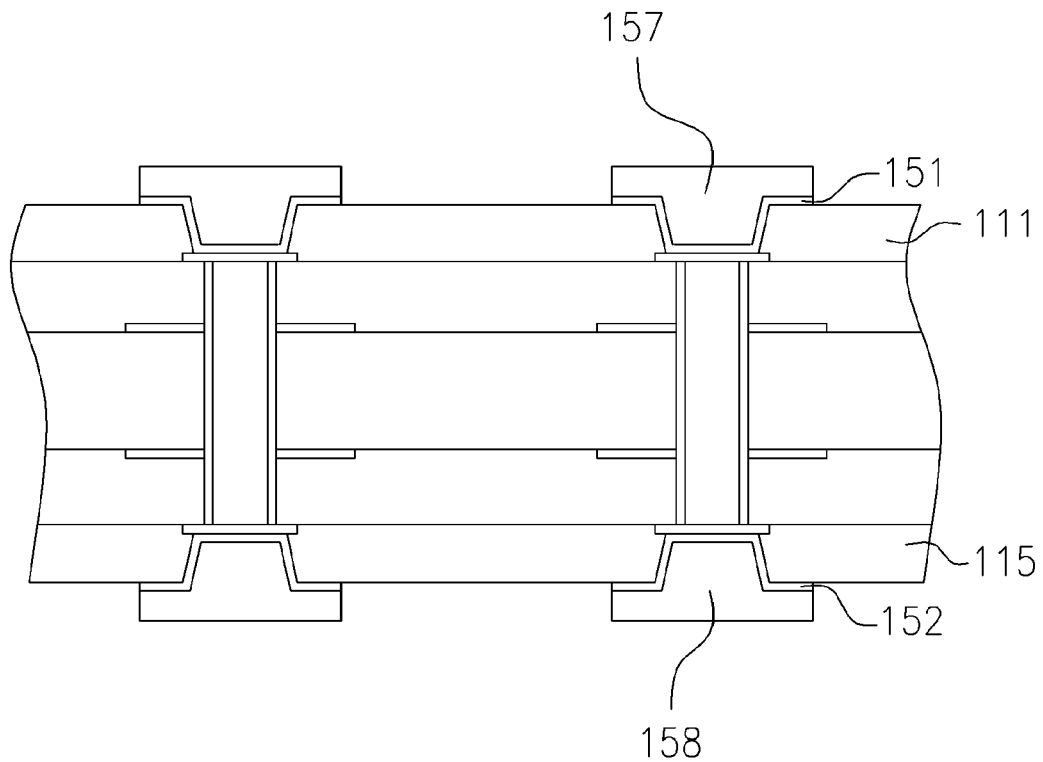
Figure 1G:
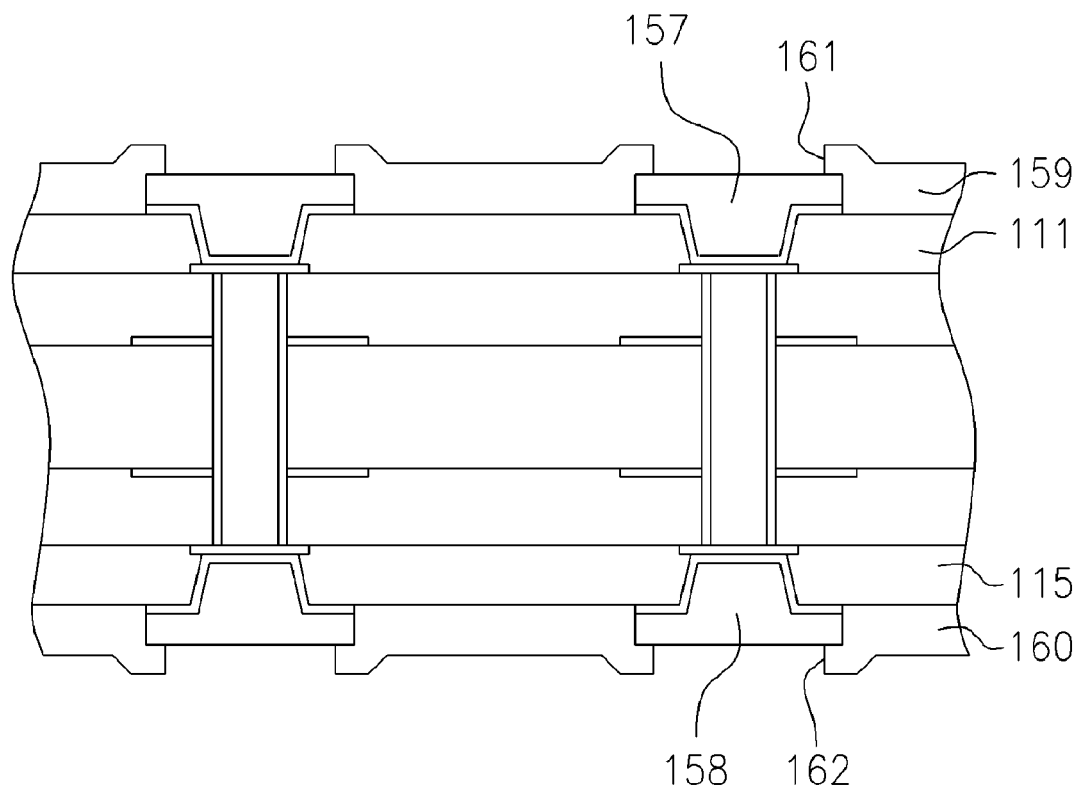

Reference will now be made in detail to the present preferred embodiments of the invention, examples of which are illustrated in the accompanying drawings. Wherever possible, the same reference numbers are used in the drawings and the description to refer to the same or like parts.

Figure 2A:
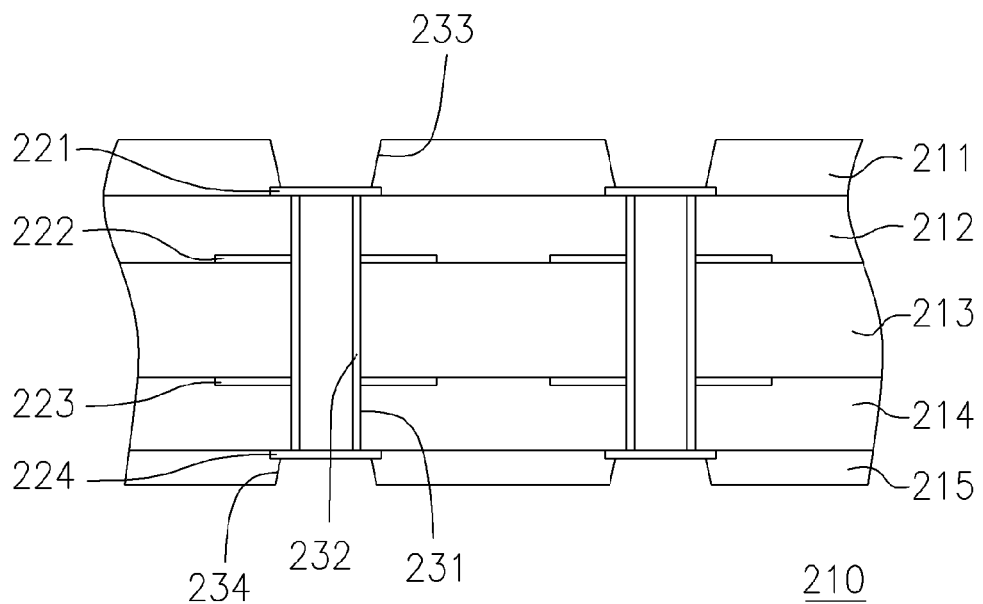
FIGS. 2A through 2O are magnified schematic cross-sectional views showing the progression of steps for fabricating a substrate according to one preferred embodiment of this invention.
Figure 2B:
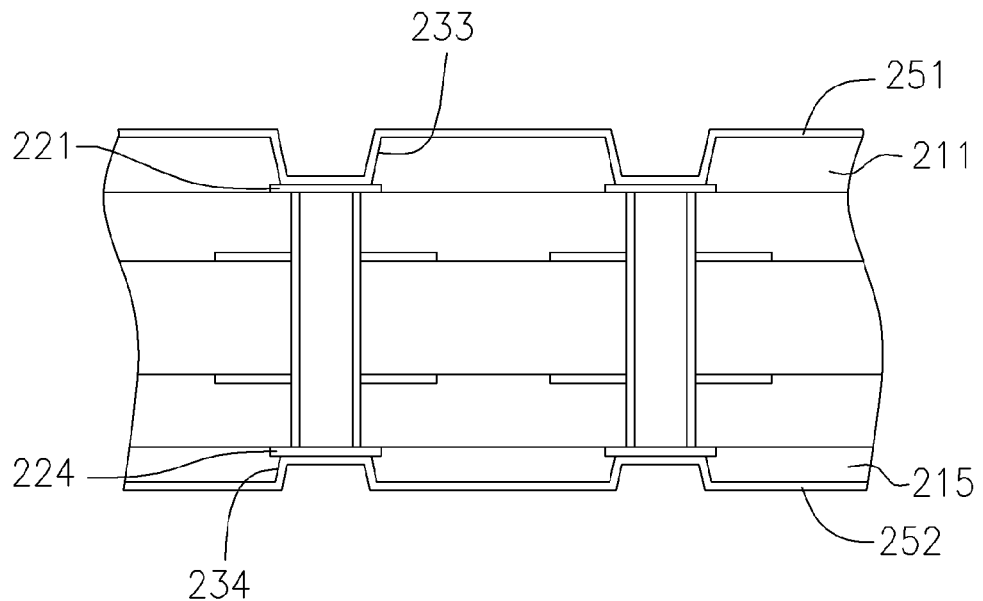
FIG. 2g is a cross-sectional view of the substrate taken along line I—I of FIG. 2G.
Figure 2C:
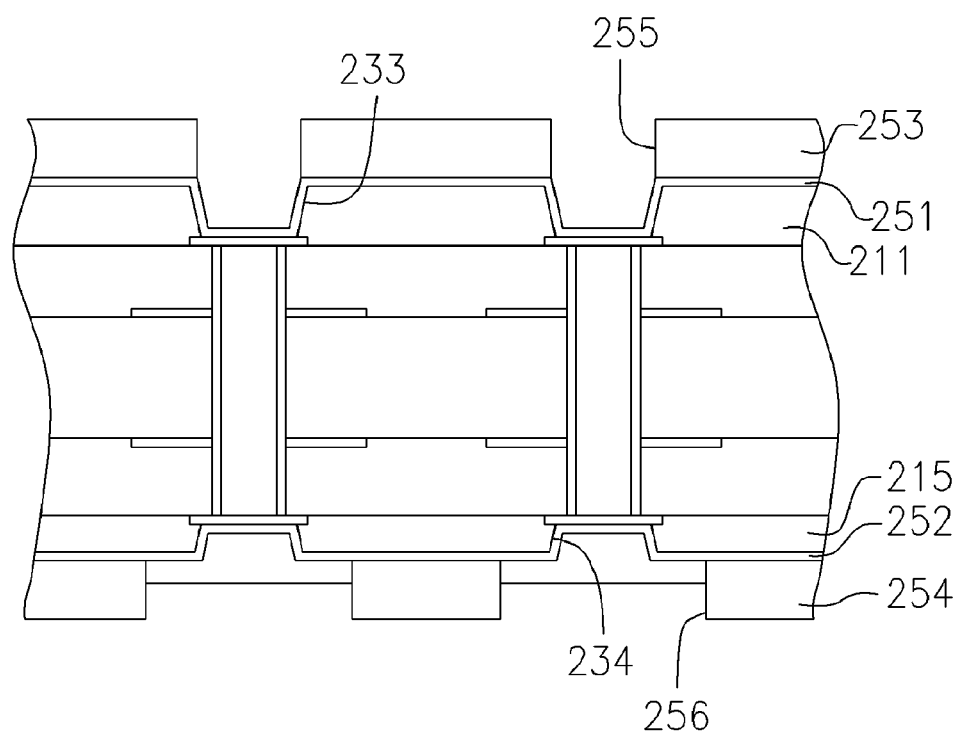
Figure 2D:
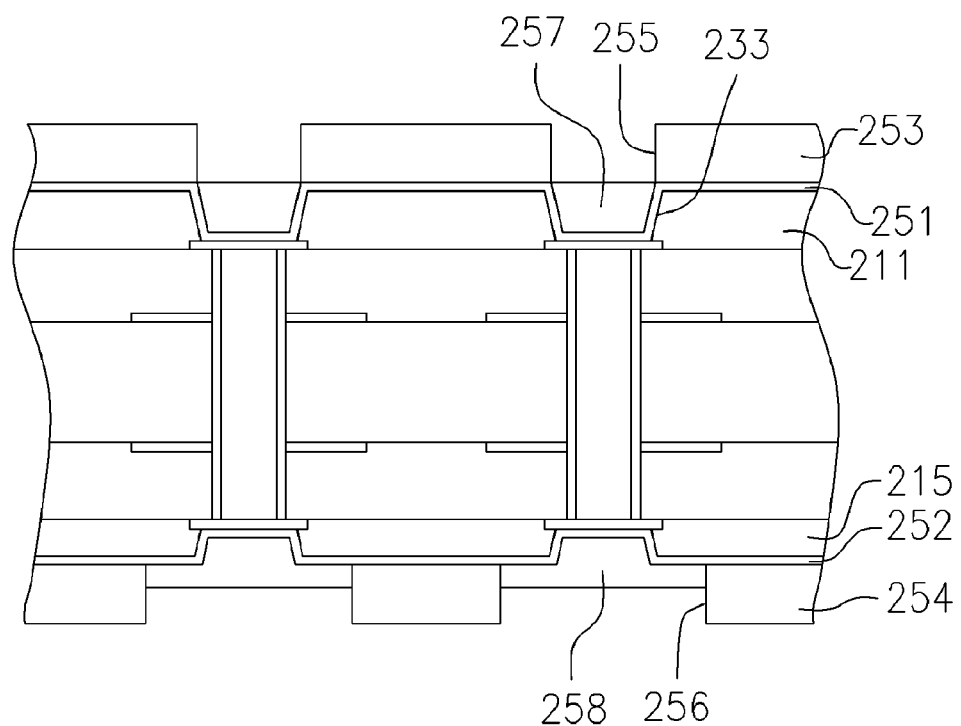
Figure 2E:
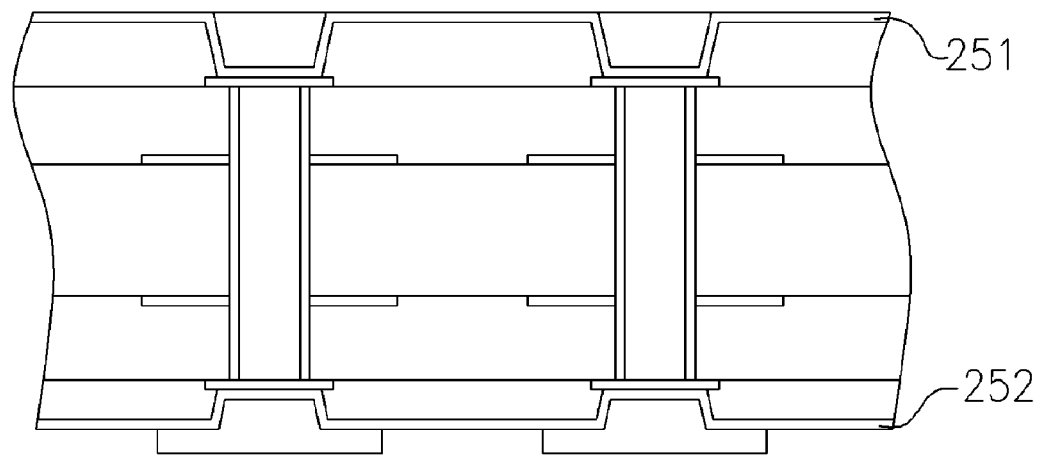
Figure 2F:
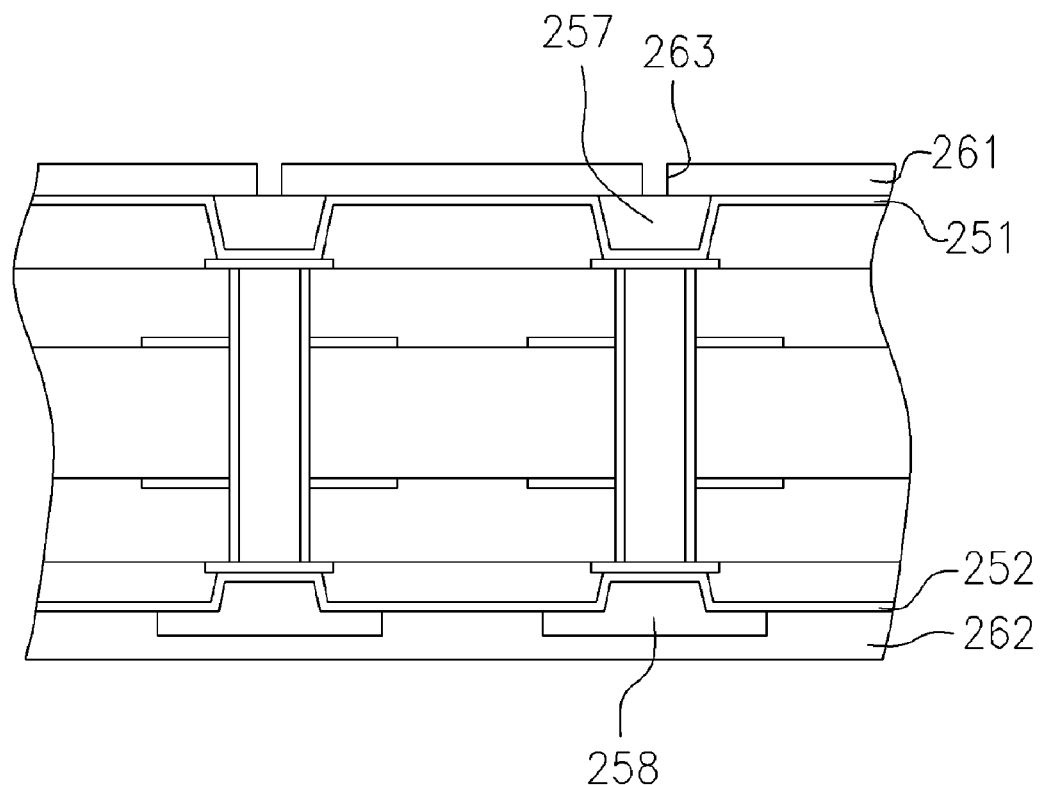
Figure 2G:
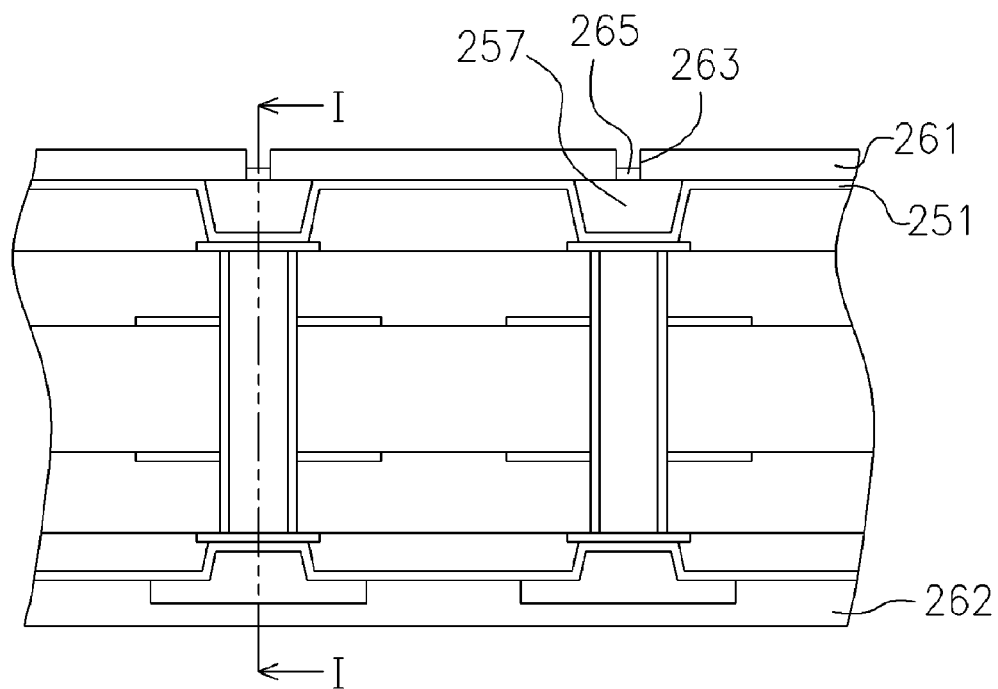
Figure 2G:
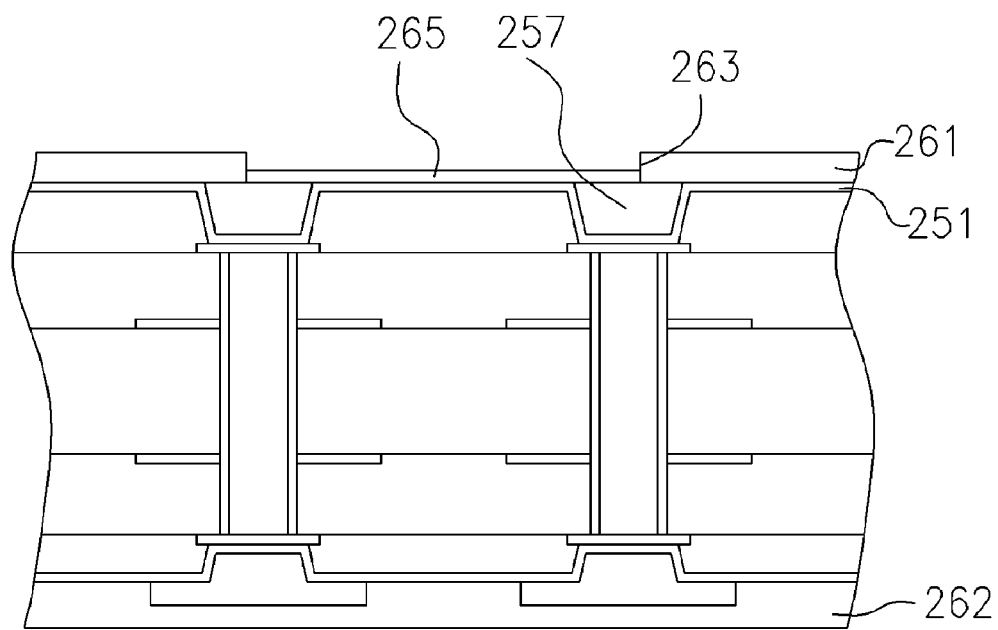
Figure 2H:
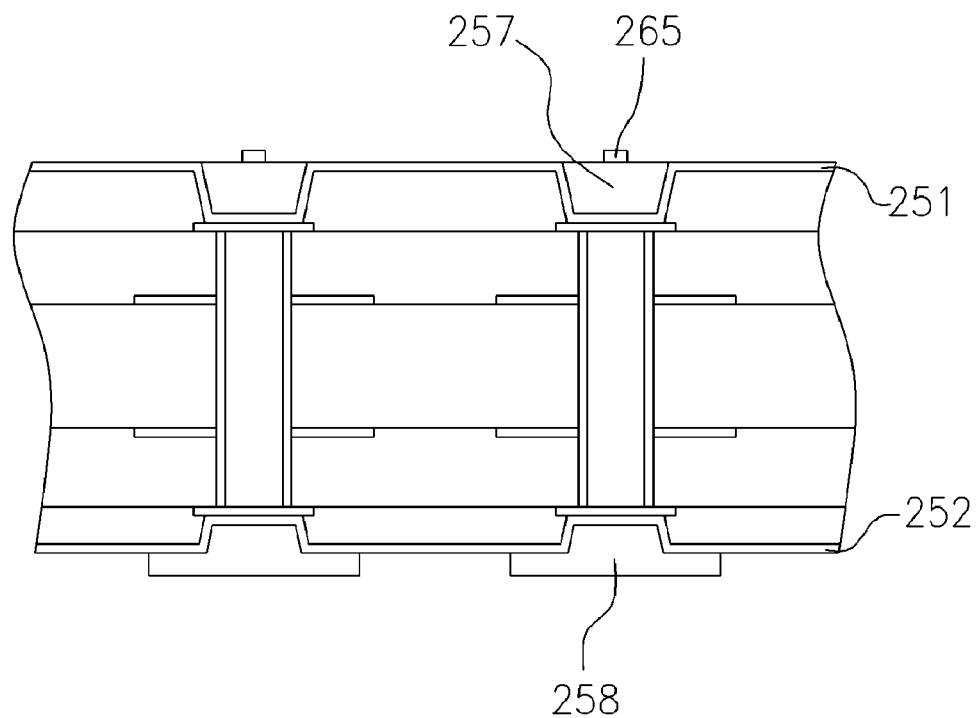
Figure 2I:
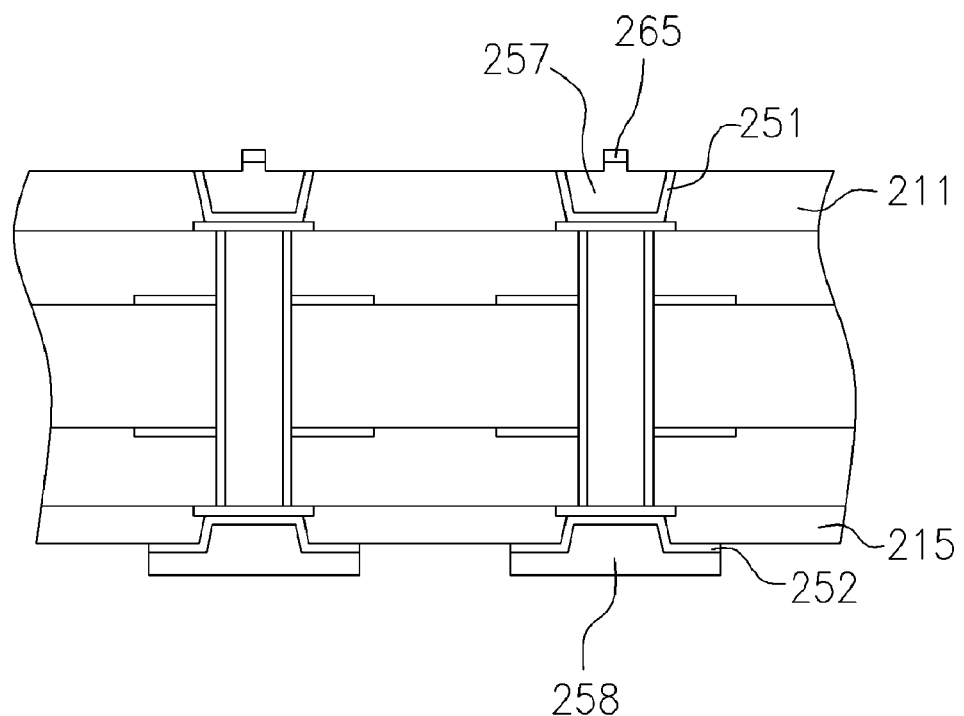
Figure 2J:
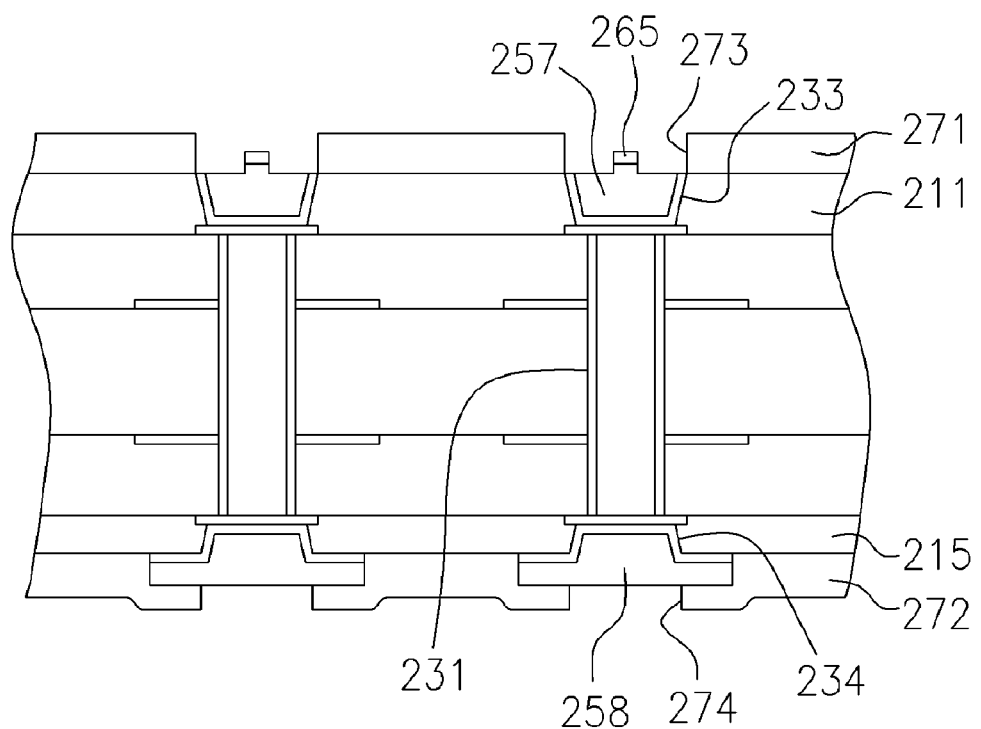
Figure 2K:
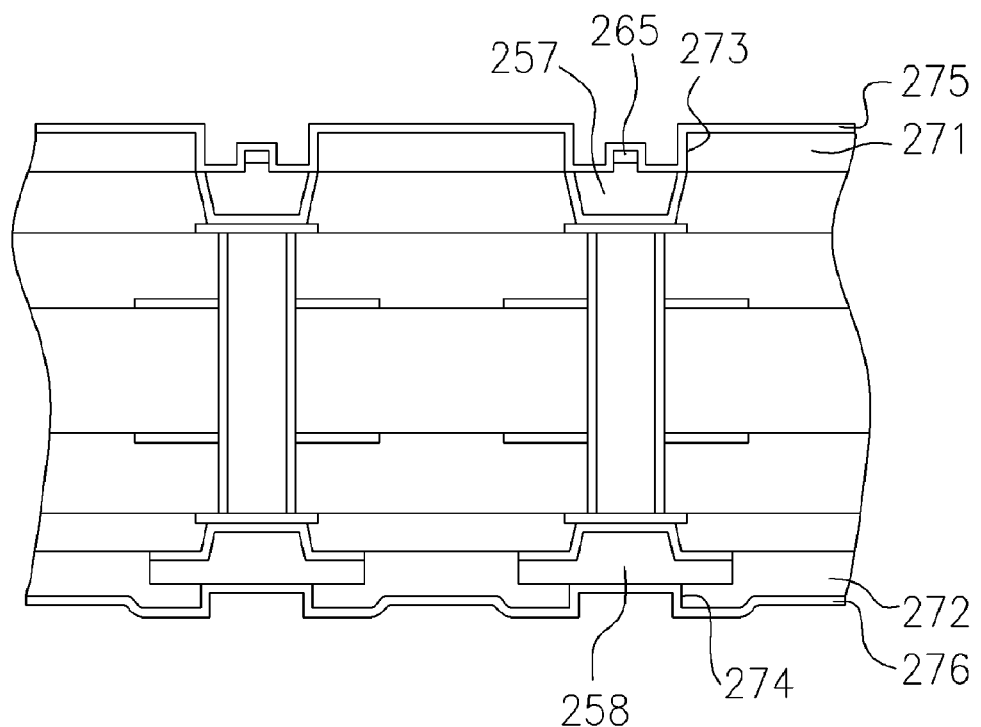
Figure 2L:
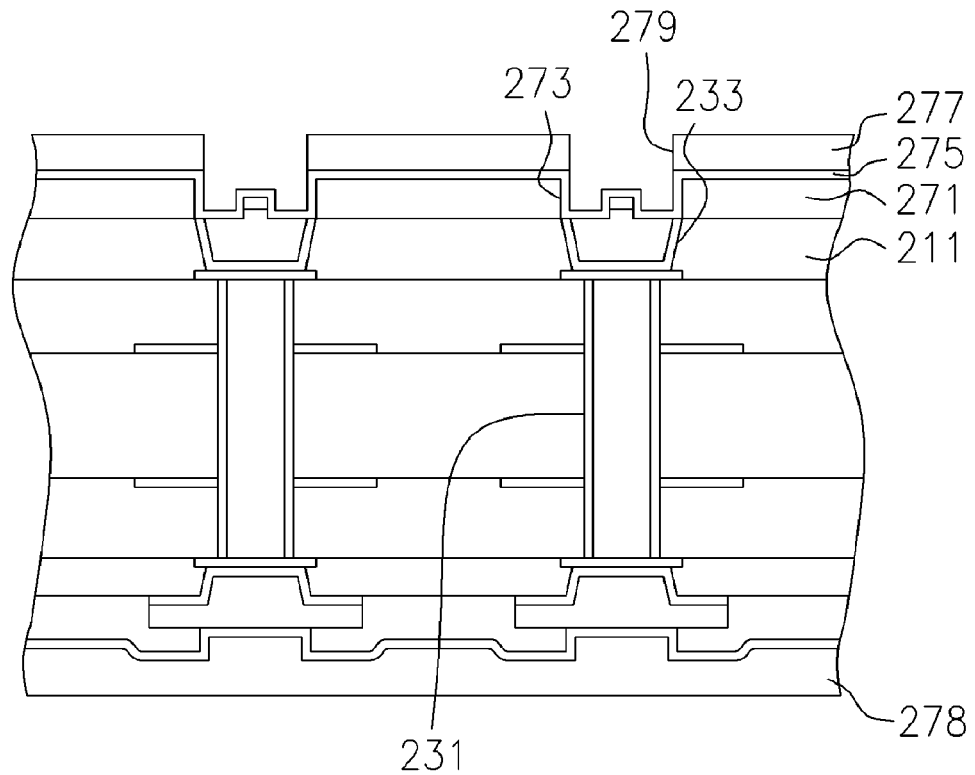
Figure 2M:
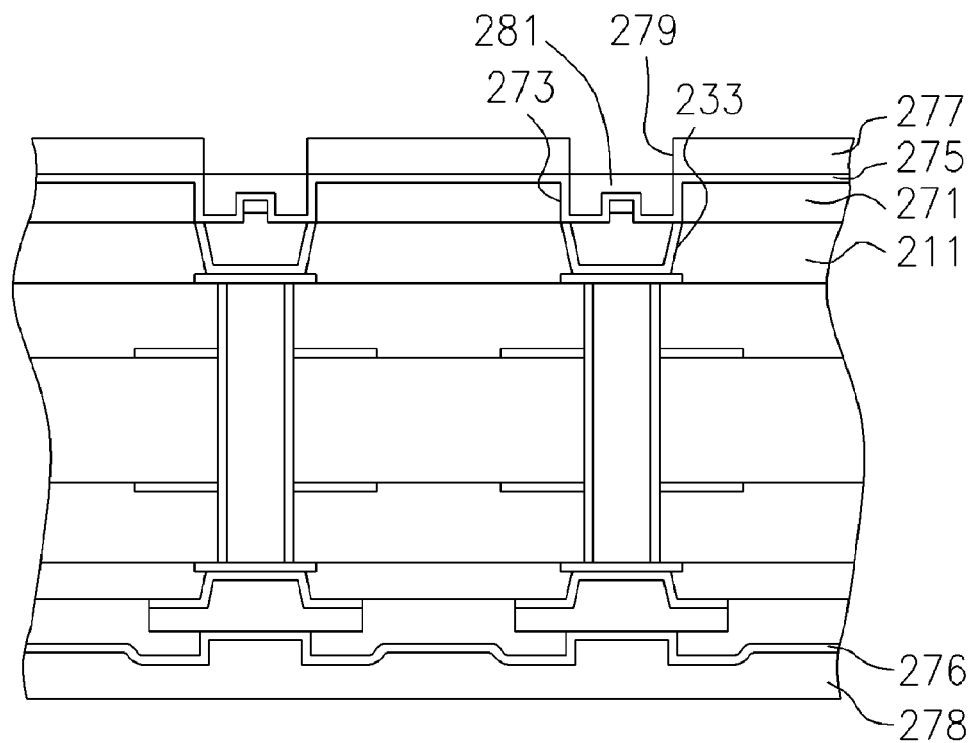
Figure 2N:
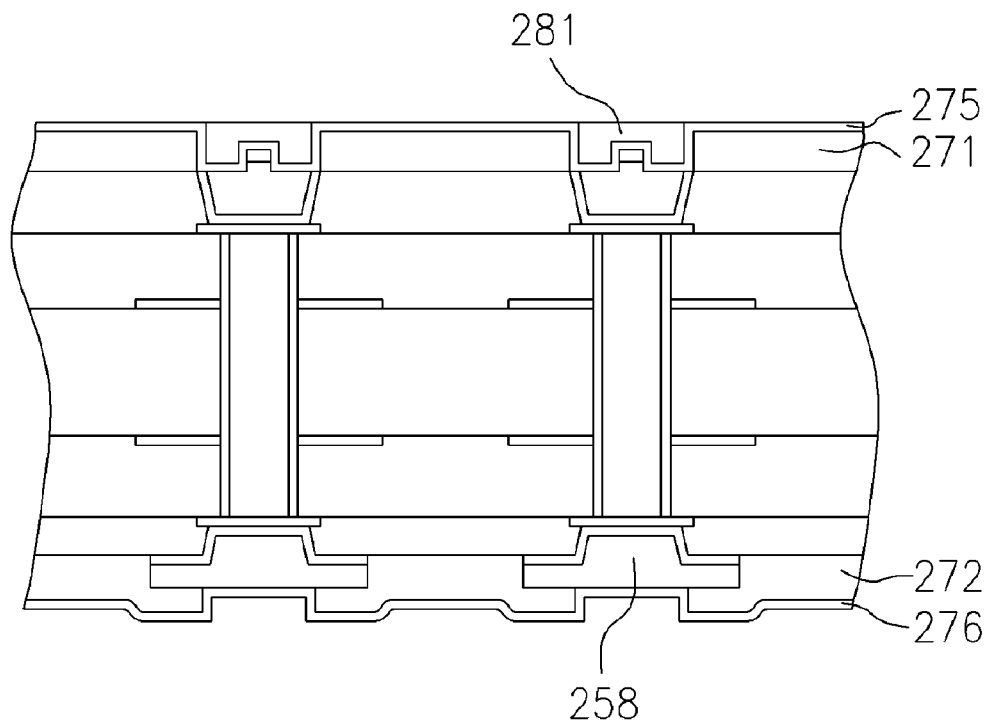
Figure 2O:
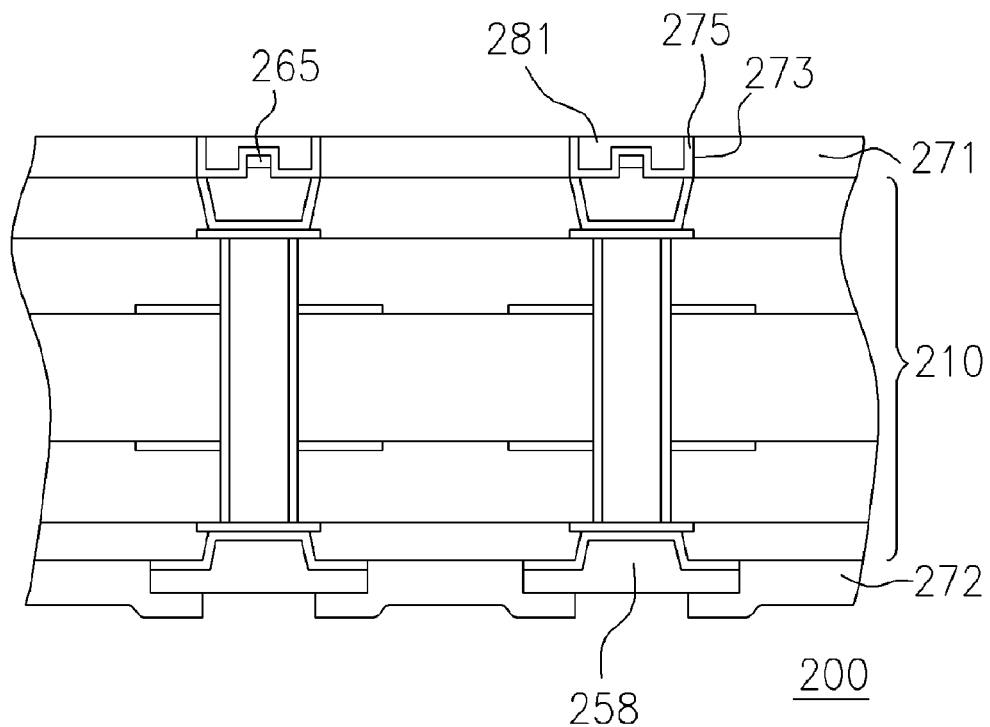

FIGS. 2A through 2O are magnified schematic cross-sectional views showing the progression of steps for fabricating a substrate according to one preferred embodiment of this invention. As shown in FIG. 2A, a semi-finished substrate 210 is provided. The substrate 210 comprises a plurality of insulating layers 211, 212, 213, 214, 215 and a plurality of patterned metallic layers 221, 222, 223, 224 alternately stacked over each other formed by a lamination or a build-up process, for example. The insulating layers 211, 212, 213, 214, 215 is fabricated using material including, for example, glass epoxy resin (FR-4, FR-5), bismaleimide-triazine (BT), epoxy resin or polyimide. The semi-finished substrate 210 furthermore has at least a through hole 231 that passes through the substrate 210. A conductive material layer 232 is formed on the wall of the through hole 231 so that the patterned metallic layers 221, 222, 223, 224 are electrically interconnected. The insulating layers 211, 215 have a plurality of openings 233, 234 that exposes the patterned circuit layers 221 and 224 respectively.

As shown in FIG. 2B, a roughening process is carried out to roughen the exposed surface of the insulating layers 211, 215. Thereafter, an electroless plating is next carried out to form seed layers 251, 252 over the insulating layers 211, 215, the sidewalls of the openings 233, 234 in the insulating layers 211, 215 as well as the patterned circuit layers 221, 114. The seed layers 251, 252 are fabricated using copper, for example.

As shown in FIG. 2C, mask layers 253, 254 are formed over the seed layers 251, 252. Thereafter, the mask layers 253, 254 are patterned to form a plurality of openings 255, 256 that exposes the seed layers 251, 252 and the openings 233, 234 in the insulating layers 211, 215. In this embodiment, the mask layers 253, 254 are photoresist layers, for example. An electroplating operation is carried out to deposit a metal into the openings 233, 234 and form the metallic layers 257, 258. A chemical solution is subsequently used to planarize the metallic layers 257, 258. The metallic layer 258 is partially filled into the opening 256 in the mask layer 254 as shown in FIG. 2D. The metallic layers 253, 254 are fabricated using copper, for example. Thereafter, the mask layers 253, 254 are removed form a structure to expose the seed layers 251, 252 to the outside, as shown in FIG. 2E. The fabrication of circuits within the substrate starts next.

As shown in FIG. 2F, mask layers 261, 262 are formed over the seed layers 251, 252. The mask layer 261 is patterned to form a plurality of openings 263. The openings 263 are shaped like a circuit pattern that exposes the seed layer 251 and the patterned metallic layer 257. In this embodiment, the mask layers 261, 262 are photoresist layers, for example.

Thereafter, an electroplating operation is carried out to form a plurality of circuit lines 265 in the patterned openings 263. The circuit lines 265 are positioned over the seed layer 251 and the patterned metallic layer 257 as shown in FIGS. 2G and 2g, where FIG. 2g is a cross-sectional view of the substrate taken along line I—I of FIG. 2G. The circuit lines 265 are fabricated using a material such as copper. Next, the mask layers 261, 262 are removed, as shown in FIG. 2H, and then the exposed seed layers 251, 252 are removed by etching, as shown in FIG. 2I. Next, a plurality of contacts is fabricated in the substrate as described below.

As shown in FIG. 2J, a screen printing operation is carried out to form solder mask layers 271, 272 over the insulating layers 211, 215. The solder mask layers 271, 272 are patterned to form a plurality of openings 273, 274. The opening 273 exposes the metallic layer 257 and the circuit line 265. The opening 274 exposes the metallic layer 258 for positioning the contact on the lower surface of the substrate. Thereafter, an electroless plating operation is carried out to form seed layers 275, 276 on the solder mask layers 271, 272 and in the openings 273, 274 of the solder mask layers 271, 272, as shown in FIG. 2K. The seed layers 275, 276 are fabricated using a material such as copper, for example. As shown in FIG. 2L, mask layers 277, 278 are formed over the seed layers 275, 276. The mask layer 277 is patterned to form an opening 279 that exposes the opening 273 in the solder mask layer 271. An electroplating operation is carried out to form a plurality of contacts 281 within the openings 273 in the solder mask layer 271 as shown in FIG. 2M. The contacts 281 are fabricated using copper, for example. Afterwards, the mask layers 277, 278 are removed to expose the seed layers 275, 276 to the outside, as shown in FIG. 2N. Finally, the exposed seed layers 275, 276 are removed as shown in FIG. 2O.

In the aforementioned process, the solder mask layer 271 does not cover any portion of the contacts 281. In other words, the contacts 281 are set within a space bounded by the sidewalls of the opening 273 in the solder mask layer 271 and the semi-finished substrate 210 and hence exist hole-free pads. The completed substrate 200 can be electrically connected with the bumps (not shown) on a flip chip via the contacts 281.

In the aforementioned embodiment, the contacts 281 are roughly aligned with the through hole 231. However, this invention is not limited as such. It is equally feasible for the contacts 281 not to be aligned with the through holes 231.

Because the contacts 281 are formed within the openings 273 only after the openings 273 are formed in the solder ask layer 271, the size of the contacts 281 is solely affected by the tolerance of the openings 273 in the solder mask layer 271. Hence, the size and the location of each contact 281 can be set more precisely. Through the reduction in the size of each contact 281 and the accurate positioning of the contacts 281, the padless contacts 281 having small contact size and small contact pitch are formed in the substrate 200. Therefore, the substrate 200 will occupy a smaller area. Similarly, with a reduction in the size and pitch of the contacts 281 in the substrate 200, the pitch of the bonding pads in the chip (not shown) can be reduced. In other words, the chip will occupy a smaller area as well.

In the aforementioned description, the non-integral circuit lines 265 and contacts 281 structure are formed on one side of the substrate. However, this invention is not limited as such. The non-integral circuit lines 265 and contacts 281 can be formed on both sides of the substrate. Last but not the least, the invention can be applied to fabricate contacts on a semi-finished substrate without forming the circuit lines.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for fabricating a substrate, at least comprising the steps of
   providing a semi-finished substrate having a plurality of insulating layers and a plurality of patterned metallic layers alternately stacked over each other, wherein the patterned metallic layers are electrically interconnected, the two outermost insulating layers in the semi-finished substrate are defined as a first insulating layer and a second insulating layer, two inner patterned metallic layers are defined as a first patterned metallic layer and a second patterned metallic layer, the first insulating layer and the second insulating layer cover the first patterned metallic layer and the second patterned metallic layer respectively, and the first insulating layer and the second insulating layer have a plurality of first openings and a plurality of second openings that expose the first patterned metallic layer and the second patterned metallic layer respectively;
   forming a first seed layer on the first insulating layer and in the first openings and forming a second seed layer on the second insulating layer and in the second openings;
   forming a first mask layer and a second mask layer over the first seed layer and the second seed layer and patterning the first mask layer and the second mask layer to form a plurality of first patterned openings and a plurality of second patterned openings, wherein the first patterned openings and the second patterned openings expose the first openings and the second openings respectively;
   depositing a first metal and a second metal into the first openings and the second openings to form a first metallic layer and a second metallic layer respectively, wherein the first metallic layer and the second metallic layer are positioned over the first seed layer and the second seed layer, and the second metallic layer is partially filled into the second patterned opening in the second mask layer;
   removing the first mask layer and the second mask layer;
   forming a third mask layer over the first seed layer and the first metallic layer and forming a fourth mask layer over the second seed layer and the second metallic layer, wherein the third mask layer has a plurality of third patterned openings that exposes the first seed layer and the first metallic layer;

forming a plurality of circuit lines inside the third patterned openings such that the circuit lines are positioned over the first seed layer and the first metallic layer;
removing the third mask layer and the fourth mask layer;
removing the exposed first seed layer and the second seed layer;
depositing a first metal and a second metal into the first openings and the second openings to form a first metallic layer and a second metallic layer respectively, wherein the first metallic layer and the second metallic layer are positioned over the first seed layer and the second seed layer, and the second metallic layer is partially filled into the second patterned opening in the second mask layer;
removing the first mask layer and the second mask layer;
forming a third mask layer over the first seed layer and the first metallic layer and forming a fourth mask layer over the second seed layer and the second metallic layer, wherein the third mask layer has a plurality of third patterned openings that exposes the first seed layer and the first metallic layer;
forming a plurality of circuit lines inside the third patterned openings such that the circuit lines are positioned over the first seed layer and the first metallic layer;
removing the third mask layer and the fourth mask layer;
removing the exposed first seed layer and the second seed layer;
forming a first solder mask layer and a second solder mask layer on the first insulating layer and the second insulating layer, wherein the first solder mask layer and the second solder mask layer has a plurality of first solder mask openings and a plurality of second solder mask openings, and the first solder mask openings at least expose a portion of the circuit lines and the second solder mask openings expose the second metallic layer;
forming a third seed layer on the first solder mask layer, in the first solder mask openings and on the circuit lines exposed by the first solder mask openings and forming a fourth seed layer on the second solder mask layer and on the second metallic layer;
forming a fifth mask layer over the third seed layer such that the fifth mask layer has a plurality of fourth patterned openings that exposes the first solder mask openings and forming a sixth mask layer over the fourth seed layer;
forming a plurality of contacts inside the first solder mask openings above the third seed layer such that the contacts and the circuit lines are electrically connected;
removing the third mask layer and the fourth mask layer; and
removing the exposed third seed layer and the fourth seed layer.

2. The substrate fabrication process of claim 1, wherein the step of forming the first seed layer and the second seed layer on the first insulating layer and the second insulating layer is performed by an electroless plating operation.

3. The substrate fabrication process of claim 1, wherein the step of forming the circuit lines inside the third patterned openings is performed by an electroplating operation.

4. The substrate fabrication process of claim 1, wherein the step of forming the first solder mask layer and the second solder mask layer on the first insulating layer and the second insulating layer is performed by a screen printing operation.

5. The substrate fabrication process of claim 1, wherein the step of forming the third seed layer and the fourth seed layer is performed by an electroless plating operation.

6. The substrate fabrication process of claim 1, wherein the step of forming the contacts inside the first solder mask openings is performed by an electroplating operation.

* * * * *